United States Patent
Friend et al.

(10) Patent No.: US 9,882,552 B2
(45) Date of Patent: Jan. 30, 2018

(54) LOW POWER AMPLIFIER

(71) Applicant: International Business Machines Corporation, Armonk, NY (US)

(72) Inventors: David M. Friend, Rochester, MN (US); Grant P. Kesselring, Rochester, MN (US); Michael A. Sperling, Poughkeepsie, NY (US); James D. Strom, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/866,529

(22) Filed: Sep. 25, 2015

(65) Prior Publication Data

US 2017/0093383 A1 Mar. 30, 2017

(51) Int. Cl.
H03K 5/02 (2006.01)
H03L 7/093 (2006.01)

(52) U.S. Cl.
CPC ............. *H03K 5/02* (2013.01); *H03L 7/093* (2013.01)

(58) Field of Classification Search
CPC ........... H03K 5/02; H03K 5/023; H03L 7/093
USPC ....................... 327/51, 52, 54, 55
See application file for complete search history.

(56) References Cited

U.S. PATENT DOCUMENTS

| | | |
|---|---|---|
| 5,027,053 A | 6/1991 | Ohri et al. |
| 5,245,571 A | 9/1993 | Takahashi |
| 5,498,984 A * | 3/1996 | Schaffer ............. G01R 19/0092 327/28 |
| 5,594,326 A | 1/1997 | Gilbert |
| 6,011,440 A | 1/2000 | Bell et al. |
| 6,028,458 A | 2/2000 | Hamaguchi |
| 6,100,712 A | 8/2000 | Anderson et al. |
| 6,608,511 B1 | 8/2003 | Hsu |
| 6,622,010 B1 | 9/2003 | Ichimaru |
| 7,907,136 B2 * | 3/2011 | Kobayashi ............ H03F 1/0277 345/100 |

(Continued)

FOREIGN PATENT DOCUMENTS

| | | |
|---|---|---|
| CN | 101710784 A | 5/2010 |
| JP | 62170093 A | 7/1987 |

(Continued)

*Primary Examiner* — William Hernandez
(74) *Attorney, Agent, or Firm* — Patterson + Sheridan, LLP

(57) ABSTRACT

A phase-locked loop (PLL) circuit, sense amplifier circuit, and method of operating a sense amplifier circuit are disclosed. The sense amplifier circuit comprises first and second operational amplifiers, each operational amplifier respectively comprising a non-inverting input terminal, an inverting input terminal, and an output stage comprising a current gating circuit having two current gating input terminals, the output stage coupled with an output terminal, the output terminal providing a feedback signal to the inverting input terminal. The input voltage signal is received across the non-inverting input terminals of the first and second operational amplifiers, and is received across the two current gating input terminals of each of the first and second operational amplifiers, wherein the sense amplifier circuit generates a sense voltage signal across the output terminals of the first and second operational amplifiers.

15 Claims, 7 Drawing Sheets

(56) References Cited

U.S. PATENT DOCUMENTS

2002/0105389 A1    8/2002  Nishimura et al.
2017/0141781 A1    5/2017  Friend et al.

FOREIGN PATENT DOCUMENTS

JP          07162288 A    6/1995
KR     1020040060167 A    7/2004

* cited by examiner

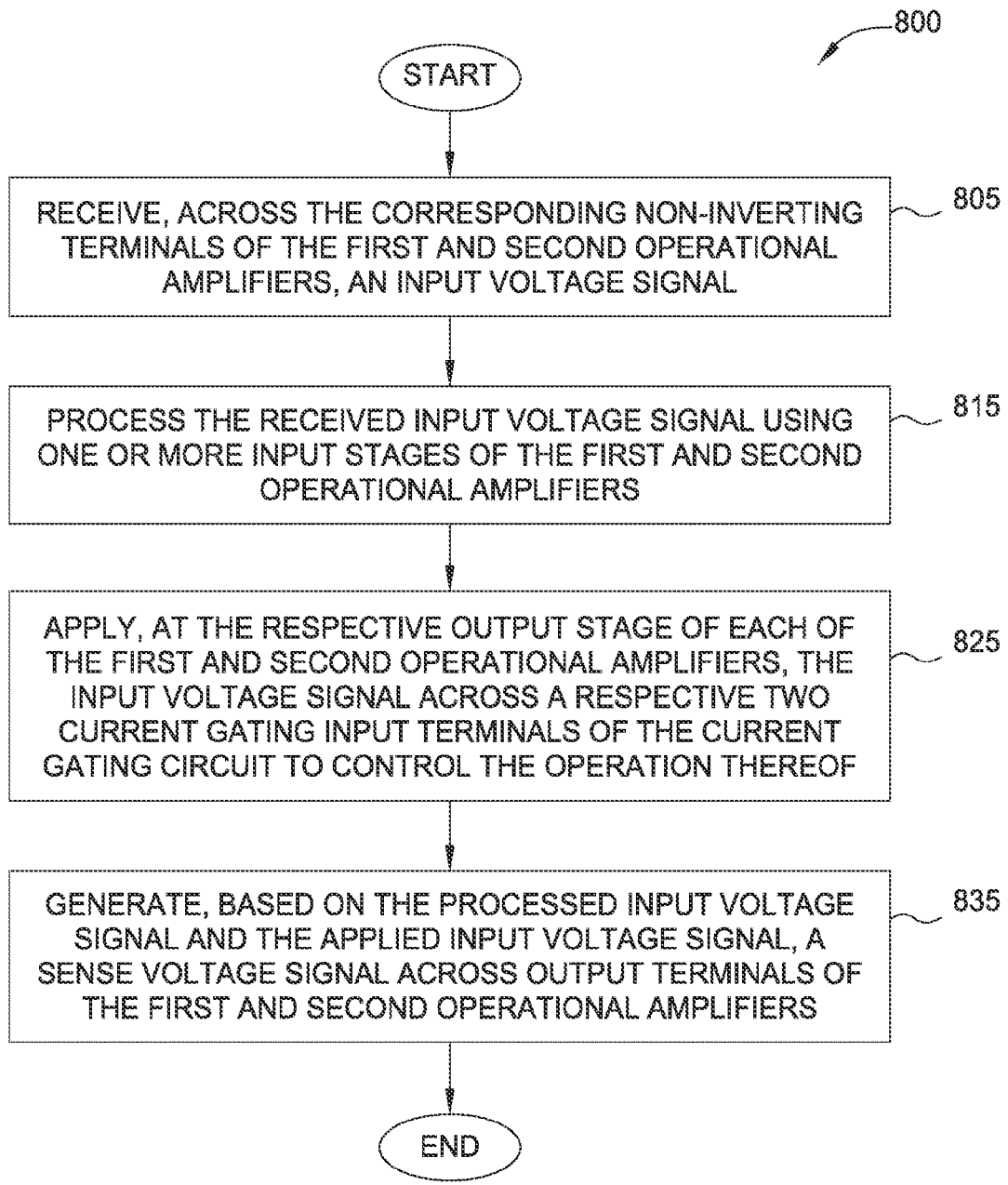

LOW POWER AMPLIFIER

BACKGROUND

The present disclosure relates to techniques for reducing standby current in sense amplifiers.

To suitably conduct the current required to drive a full rail-to-rail output, transistors and/or other components of an amplifier circuit may have relatively large dimensions. However, during operation of the amplifier circuit when output is not near the rail(s), the larger dimensioned components typically require a greater level of standby current, which increases power losses of the amplifier circuit.

SUMMARY

According to one embodiment, a phase-locked loop (PLL) circuit is disclosed that comprises a phase detector configured to generate a phase difference signal based on a received reference clock signal and a feedback clock signal. The PLL circuit further comprises a filter circuit, a charge pump configured to generate, based on the phase difference signal, a filter voltage signal across the filter circuit. The PLL circuit further comprises sense amplifier circuitry configured to generate a sense voltage signal based on the filter voltage signal, wherein the filter voltage signal is applied to an output stage of the sense amplifier circuitry, and wherein the charge pump is further configured to generate the filter voltage signal based on the sense voltage signal. The PLL circuit further comprises a variable frequency oscillator configured to generate an output signal having a frequency based on the filter voltage signal, wherein the feedback clock signal is based on the output signal.

According to another embodiment, a sense amplifier circuit is disclosed for receiving an input voltage signal. The circuit comprises first and second operational amplifiers, wherein each operational amplifier respectively comprises a non-inverting input terminal, an inverting input terminal, and an output stage comprising a current gating circuit having two current gating input terminals, the output stage coupled with an output terminal, the output terminal providing a feedback signal to the inverting input terminal. The input voltage signal is received across the non-inverting input terminals of the first and second operational amplifiers, and is received across the two current gating input terminals of each of the first and second operational amplifiers, and the sense amplifier circuit generates a sense voltage signal across the output terminals of the first and second operational amplifiers.

According to another embodiment, a method is disclosed of operating a sense amplifier circuit comprising first and second operational amplifiers, each operational amplifier respectively comprising non-inverting and inverting input terminals and an output stage including a current gating circuit. The method comprises receiving, across the corresponding non-inverting input terminals of the first and second operational amplifiers, an input voltage signal, and processing the received input voltage signal using one or more input stages of the first and second operational amplifiers. The method further comprises applying, at the respective output stage of each of the first and second operational amplifiers, the input voltage signal across a respective two current gating input terminals of the current gating circuit to control the operation thereof, and generating, based on the processed input voltage signal and the applied input voltage signal, a sense voltage signal across output terminals of the first and second operational amplifiers.

BRIEF DESCRIPTION OF THE SEVERAL VIEWS OF THE DRAWINGS

FIG. 8 is a method of operating a sense amplifier circuit, according to one embodiment.

DETAILED DESCRIPTION

Figure 1:
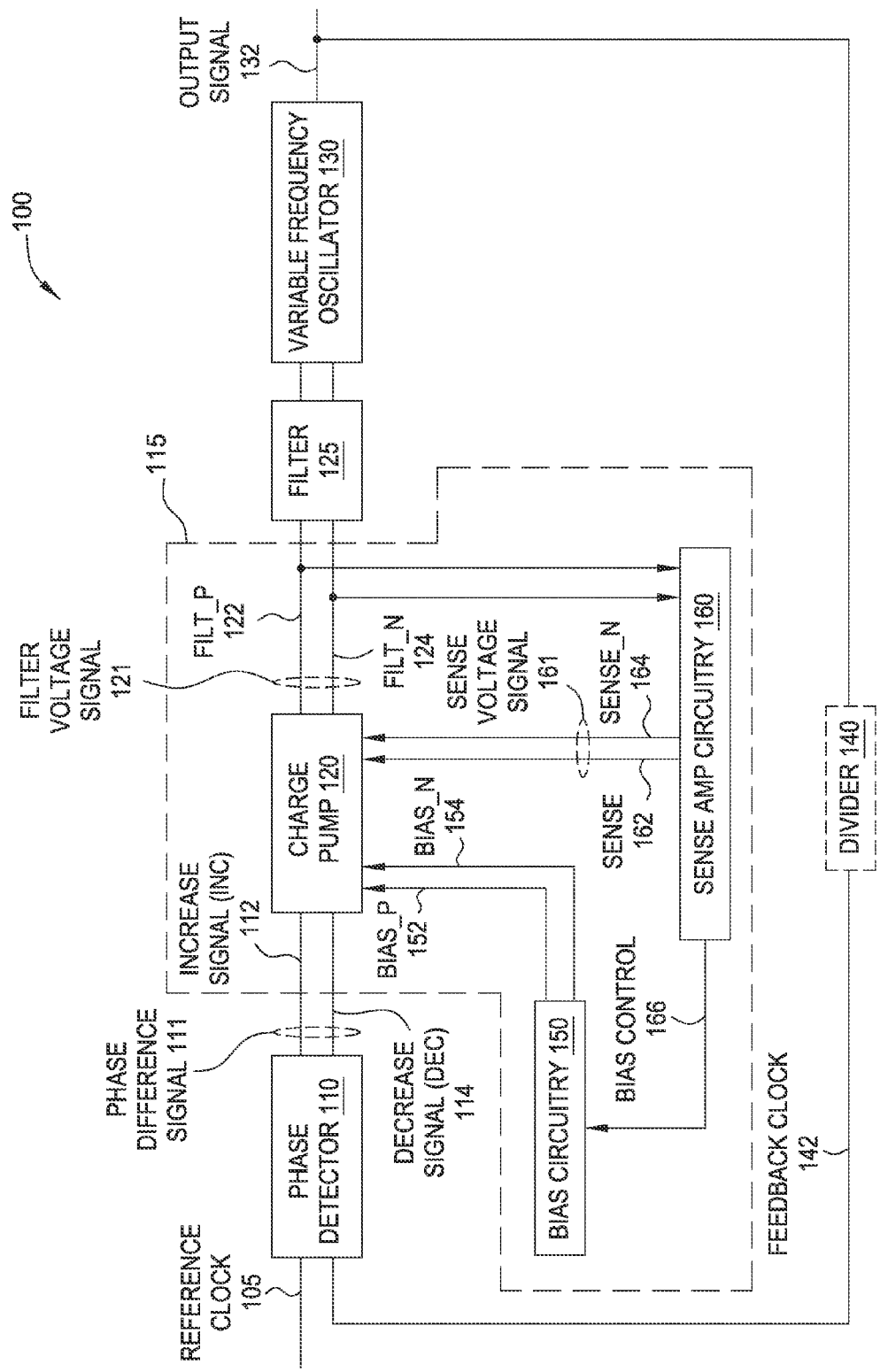
FIG. 1 is a block diagram illustrating a phase-locked loop (PLL) circuit that includes a sense amplifier, according to one embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system."

Embodiments are generally directed to a sense amplifier circuit, associated method for operation, and phase-locked loop (PLL) circuit including a sense amplifier circuit. The sense amplifier circuit, which comprises first and second operational amplifiers (or "op-amps"), is configured to receive an input voltage signal across non-inverting input terminals of the first and second op-amps. The op-amps each include a respective output stage having a current gating circuit, where the current gating circuit is configured to receive the input voltage signal across two current gating input terminals. The output terminal of each op-amp provides a feedback signal to the inverting input of the op-amp.

In some embodiments, application of the input voltage signal to the current gating circuit operates to control a conductance of the current gating circuit. In some embodiments, the output stage includes a CMOS inverter, and the current gating circuit is disposed between a drain terminal of a p-channel metal-oxide-semiconductor field-effect transistor (PFET) of the CMOS inverter, and a drain terminal of an n-channel metal-oxide-semiconductor field-effect transistor (NFET) of the CMOS inverter.

Including the current gating circuit generally operates to reduce a standby current consumption of the associated sense amplifier, control loop circuit, etc. while maintaining good common-mode control. The effects may be most pronounced in cases where, for circuits that are coupled with first and second rail voltages, the input voltage signal is about halfway between the first and second rail voltages. In one example discussed herein, the standby current in a charge pump of a PLL circuit is reduced by approximately two-thirds using the current gating circuit and associated techniques.

FIG. 1 is a block diagram illustrating a phase-locked loop (PLL) circuit that includes a sense amplifier, according to one embodiment. The PLL circuit 100 generally includes a phase detector 110, charge pump 120, filter circuit 125, and variable frequency oscillator 130.

The phase detector 110 may have any suitable implementation, such as an analog phase detector using a frequency mixer or multiplier, a digital phase detector using a sample and hold circuit, a charge pump, or other digital logic, a phase-frequency detector, and so forth. The phase detector 110 generally operates to produce a phase difference signal 111 that represents a difference in phase between a reference clock signal 105 and a feedback clock signal 142. The feedback clock signal 142 is based on an output signal 132 of the variable frequency oscillator 130. The phase difference signal 111 includes an increase signal (INC) 112 component produced by the phase detector 110 on a first connection (such as a conductive wire or trace) with the charge pump 120, and a decrease signal (DEC) 114 component produced on a second connection with the charge pump 120. In some cases, the INC 112 and DEC 114 signals may be pulses having widths based on the determined phase difference. For example, if the feedback clock signal 142 had a higher frequency than the reference clock signal 105, the phase detector 110 produces a pulse on the DEC 114 (e.g., drive the line "high" for a period) while holding the INC 112 at a fixed voltage (e.g., ground or other logic "low" voltage). The pulses of DEC 114 signal affects the operation of the charge pump 120, which will in turn reduce the frequency of the variable frequency oscillator 130, reducing the output frequency toward the frequency of reference clock 105. In other implementations of the phase detector 110, the pulses of the INC 112 and DEC 114 signals can be at least partly overlapping. For example, pulse(s) of the INC 112 signal may be contemporaneous with pulse(s) of the DEC 114 signal, but the pulse(s) of INC 112 signal have a shorter duration and/or may be fewer in number to reduce output frequency of the variable frequency oscillator 130.

The charge pump 120 receives the INC 112 and DEC 114 signals and produces a filter voltage signal 121 across the filter element 125, which is used to control the operation of the variable frequency oscillator 130. Generally, the charge pump 120 represents a bipolar switched current source, meaning that the charge pump 120 can source both positive and negative current pulses into the filter element 125. The filter voltage signal 121 includes a FILT_P 122 component and a FILT_N 124 component. In some embodiments, the FILT_N 124 component represents a substantially inverted copy of the FILT_P 122 component.

The filter circuit 125 may include any number of elements selected to control dynamics of the control loop (here, PLL circuit 100). In some embodiments, the filter circuit 125 is a low-pass filter comprising a capacitive element. In some embodiments, the filter circuit 125 may include proportional elements, high-pass filter elements, etc.

The variable frequency oscillator 130 produces output signal 132 based on the received filter voltage signal 121. The variable frequency oscillator 130 may have any suitable implementation, such as a voltage-controlled oscillator (VCO), a numerically controlled oscillator (NCO), and so forth. In some embodiments, the output signal 132 is processed (such as through a divider 140) to produce a feedback clock signal 142 that differs from the output signal 132. In other embodiments, the output signal 132 is the feedback clock signal 142.

The PLL circuit 100 may include additional circuitry associated with operation of the charge pump 120 (depicted within region 115). In some embodiments, the PLL circuit 100 includes sense amplifier circuitry 160 (or "sense amp circuitry," "sense amplifier circuit," etc.) that receives the filter voltage signal 121 and produces a sense voltage signal 161. The sense voltage signal 161 includes a SENSE 162 component and a SENSE_N 164 component. In some implementations of the sense amp circuitry 160, the sense voltage signal 161 substantially tracks or follows the received filter voltage signal 121. In some cases, the SENSE 162 component tracks the FILT_P 122 component of the filter voltage signal 121, and the SENSE_N 164 component tracks the FILT_N 124 component. The operation of the charge pump 120 may be controlled based on the received sense voltage signal 161. The sense amp circuitry 160 may further produce a bias control signal 166, which when applied to suitable bias circuitry 150, provides a biasing signal (shown as BIAS_P 152 and BIAS_N 154) to the charge pump 120 to further control the operation thereof.

While the PLL circuit 100 has been depicted, the person of ordinary skill in the art will recognize the applicability of sense amplifier circuitry 160 to various other analog and/or digital control loop circuits.

Figure 2:
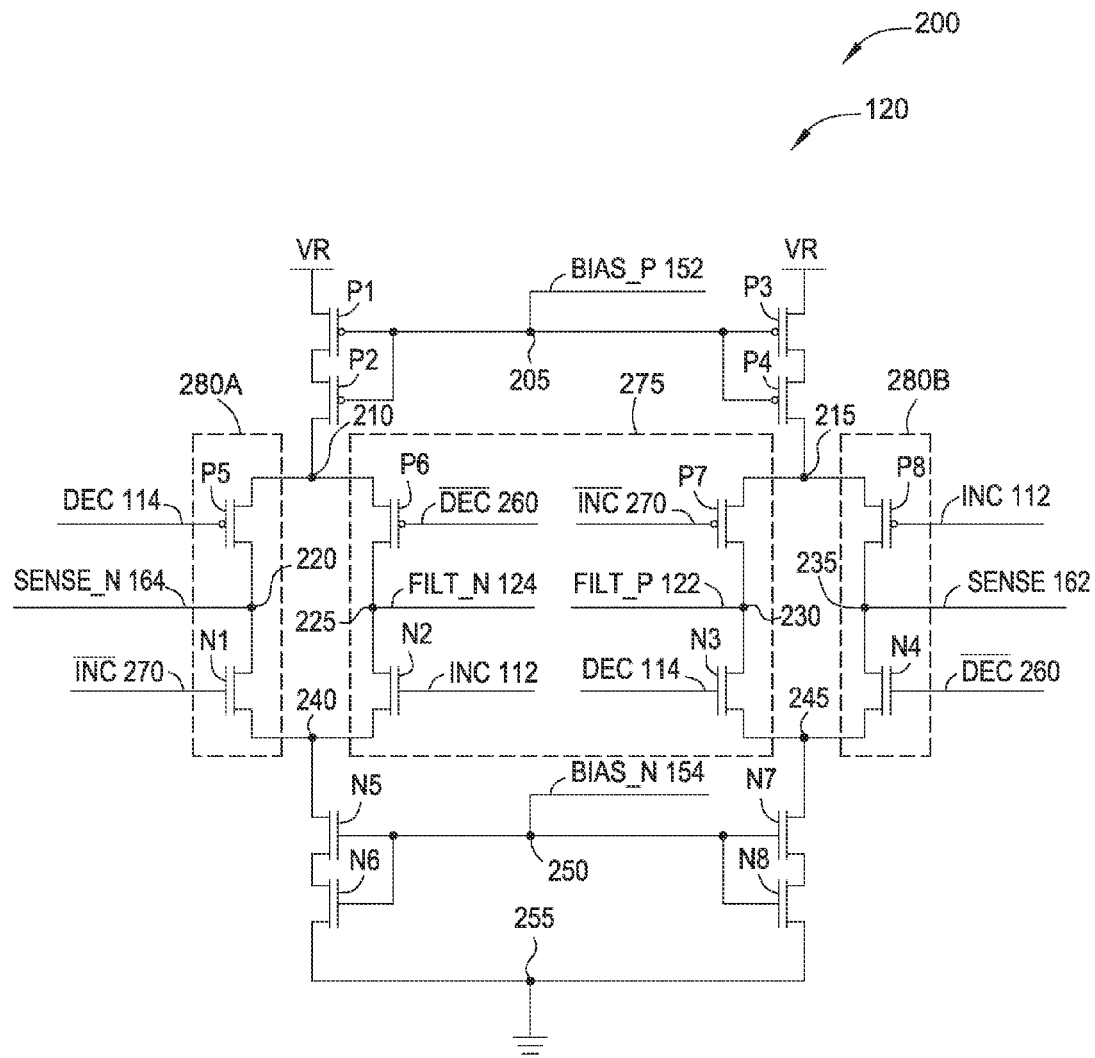
FIG. 2 illustrates an exemplary configuration of a charge pump configured to couple with a sense amplifier, according to one embodiment.

FIG. 2 illustrates an exemplary configuration of a charge pump configured to couple with a sense amplifier, according to one embodiment. The arrangement 200 represents one possible configuration of the charge pump 120 described above.

Charge pump 120 is connected with two voltage rails, VR and ground, at various points in the circuit. However, other rail voltages are possible. The charge pump 120 also includes transistors P1-P8 and N1-N8. While each of P1-P8 and N1-N8 are described as respective p-channel and n-channel metal-oxide-semiconductor field-effect transistors (PFETs, NFETs), other types of transistors or switching devices may be used consistent with the techniques discussed herein.

The charge pump 120 receives the BIAS_P 152 signal at node 205 and the BIAS_N 154 signal at node 250. The BIAS_P 152 and BIAS_N 154 signals are generated from bias circuitry 150 of FIG. 1. BIAS_P 152 and BIAS_N 154, when applied to the respective nodes 205, 255, control the voltage of respective nodes 210, 215 and 240, 245. In some embodiments, the PFETs P1-P4 have the same properties (e.g., same conductivity, dimensions), and NFETs N5-N8 have the same properties.

The remaining PFETs P5-P8 and NFETs N1-N4 of arrangement 200 are generally arranged as an h-bridge 275 and alternate paths 280A and 280B. The h-bridge 275 includes PFETs P6, P7 and NFETs N2, N3, which are collectively operated based on received INC 112 and DEC 114 signals to produce the FILT_P 122 and FILT_N 124 signals to charge and/or discharge the filter circuit coupled between the nodes 225, 230. Although not shown, inverters may be included to produce the not-DEC 260 signal (also "DEC*"; illustrated as over-lined DEC) from DEC 114, and the not-INC 270 signal ("INC*"; illustrated as over-lined INC) from INC 112. The alternate path 280A includes PFET P5 and NFET N1, and alternate path 280D includes PFET P8 and NFET N4.

As shown, DEC 114 is applied to the gate of N3, DEC* 260 is applied to the gate of P6, INC 112 to the gate of N2, and INC* 270 to the gate of P7. Within path 280A, DEC 114 is applied to the gate of P5, INC* 270 to the gate of N1. Within path 280B, INC 112 is applied to the gate of P8 and DEC* 260 to the gate of N4.

During operation, current conducted from the nodes 210, 215 to nodes 240, 245 through selected paths within h-bridge 275 or along alternate paths 280A, 280B. The paths are selected based on the logic states of the INC 112 and DEC 114 signals. Referring back to FIG. 1, and using operation of the PLL circuit 100 as an example, say at a first time that the feedback clock signal 142 (produced based on the output signal 132 from the variable frequency oscillator 130) matches the reference clock signal 105. Therefore, the frequency of the variable frequency oscillator 130 does not need to be changed. Accordingly, the phase detector 110 does not need to send pulses (high) on either the INC 112 or DEC 114 lines to change the voltage across the filter circuit 125 (i.e., the voltage difference between the FILT_P 122 and FILT_N 124 signals). Thus, INC 112 is held at a logic "low" (or "0"), INC* 270 is "high" (logic "1"), DEC 114 is held low (0), and DEC* 260 is high (1). Applying these values to the charge pump 120 of FIG. 2, and specifically between nodes 210 and 240, PFET P5 (DEC 114=0) and NFET N1 (INC* 270=1) within path 280A are conducting, while PFET P6 (DEC* 260=0) and NFET N2 (INC 112=0) of the h-bridge 275 are not conducting. Thus, current is conducted along path 280A from node 210 through PFET P5 and NFET N1 to node 240, instead of through the h-bridge 275. Similarly, PFET P8 and NFET N4 are conducting in path 280B while PFET P7 and NFET N3 of the h-bridge 270 are not conducting, such that current travels from node 215 through path 280B to node 245.

Again referring to FIG. 1, when the feedback clock signal 142 varies from the reference clock signal 105 (say, having a greater or lesser frequency), the PLL circuit 100 responds by changing the voltage across the filter circuit 125. Continuing the previous example, at a second time say that a frequency of the feedback clock signal 142 is less than the frequency of the reference clock signal 105, meaning that the PLL circuit 100 needs to increase the frequency of the variable frequency oscillator 130. To increase the frequency, the PLL circuit 100 sends an INC 112 signal (pulse) to charge pump 120, while the DEC 114 signal is held low. Thus, INC 112 is in a "high" state (1), while INC* 270 is low (0), DEC 114 is low (0), and DEC* 260 is high (1). Within the h-bridge 275, PFET P7 (INC* 270=0) is conducting while NFET N3 (DEC 114=0) is not conducting, allowing the voltage at node 230 to increase due to being coupled with node 215. PFET P6 (DEC* 260=1) is not conducting and N2 (INC 112=1) is conducting, allowing the node 225 to decrease voltage due to coupling with node 240. Coupling node 230 with node 215 and/or coupling node 225 with node 240 causes the voltage difference between FILT_P 122 and FILT_N 124 to increase, which in turn causes the variable frequency oscillator to increase its frequency.

However, if the voltages at the nodes 220, 235 are permitted to float, current may flow from those nodes when switching between a first state of charging or discharging the FILT_P 122 and FILT_N 124 nodes using the h-bridge 275 and a second state of directing current through paths 280A, 280B. The floating charge on the nodes 220, 235 can be caused by the relative properties (e.g., relative conductivity) of the PFET and NFET located in each of the alternate paths 280A, 280B. The current from nodes 220, 235, which may be described as an "error current," "shoot-through current," etc., may cause undesired effects on the performance of the circuit associated with the charge pump 120 (e.g., PLL circuit 100). For example, say that node 235 had a voltage greater than node 230 at the second time (i.e., when the pulse was sent on INC 112). The additional charge held at node 235 may couple with the node 230 during switching paths from the path 280B to the h-bridge 275, which could cause the voltage to overshoot or undershoot (resulting in a longer settling time until equilibrium is reached). In some embodiments, therefore, nodes 220, 235 are coupled with sense amplifiers to cause the voltage of the nodes (SENSE_N 164, SENSE 162) to track or follow the respective voltages at nodes 225, 230 (FILT_N 124, FILT_P 122). Thus, when switching paths based on the INC 112 and DEC 114 signals, no potential difference exists between nodes 220 and 225, and between 230 and 235, and any error current is mitigated thereby.

However, because the FILT_P 122 and FILT_N 124 signals may be driven nearly rail-to-rail during operation of the charge pump 120, the sense amplifier circuit needs to be able to drive the SENSE 162, SENSE_N 164 signals to the same levels. Thus, the components of the associated sense amplifiers must be sufficiently large to conduct the currents needed to produce the full rail voltages. In many cases, however, the processes using the sense amplifier are relatively centered (or at least away from the rail voltages for a significant portion of the time), so a significant amount of standby current flows through the sense amplifiers due to their large dimensions. For example, the PLL circuit naturally seeks to reach a frequency equilibrium and remain there, such that voltage swings to the rail voltages are not typically frequent. The standby current of the sense amplifier at an operational point halfway between the rail voltages can constitute a significant portion of the entire power consumption of the larger circuit. For example, for a PLL circuit conducting about 10 mA, about 4 mA of this may be essentially wasted due to standby current in the sense amplifier. Even beyond concerns of wasted power, a large standby current can be problematic as FETs implemented with smaller feature sizes (e.g., FINFET) handle tend to handle larger currents less reliably. Additionally, self-heating that is caused by the standby current can also degrade the performance of the PLL circuit.

Figure 3:
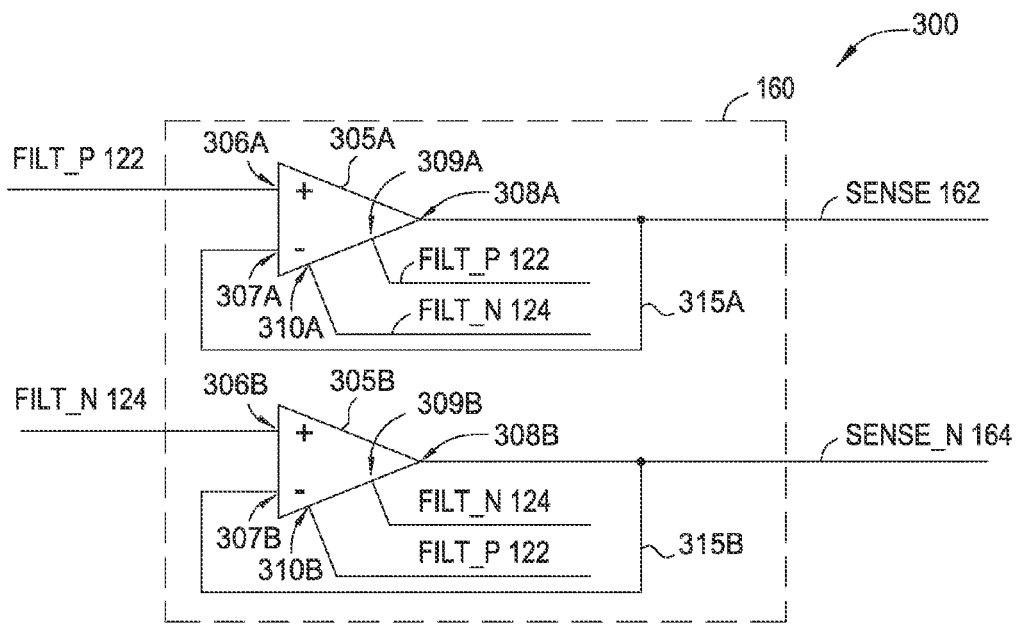
FIG. 3 is a block diagram illustrating an exemplary sense amplifier, according to one embodiment.

FIG. 3 is a block diagram illustrating an exemplary sense amplifier, according to one embodiment. The arrangement 300 is generally one possible implementation of sense amplifier circuit 160. Operational amplifiers (or "op-amps") 305A, 305B each have corresponding non-inverting input terminals 306A, 306B, inverting input terminals 307A, 307B, and output terminals 308A, 308B. The output terminals 308A, 308B are coupled with the respective inverting input terminals 307A, 307B and provide feedback signals 315A, 315B. While shown as a direct connection between output terminals 308A, 308B and inverting input terminals 307A, 307B, the sense amplifier circuit 160 may alternately include one or more circuit elements in the feedback loop, such as a voltage divider circuit. Each of the op-amps 305A, 305B include an output stage (not shown) that includes a current gating circuit. The current gating circuits of op-amps 305A, 305B each include two respective current gating input terminals 309A, 310A, and 309B, 310B.

The filter voltage signal (having components FILT_P 122 and FILT_N 124) is received across the non-inverting terminals 306A, 306B. As shown, FILT_P 122 is applied to op-amp 305A, and FILT_N 124 is applied to op-amp 305B. The filter voltage signal is also applied across the current gating input terminals 309A, 310A and 309B, 310B of each of the op-amps 305A, 305B to control operation of the current gating circuit. The sense amplifier circuit 160 generates a sense voltage signal (having components SENSE 162, SENSE_N 164) across the output terminals 308A, 308B of the op-amps 305A, 305B.

Figure 4:
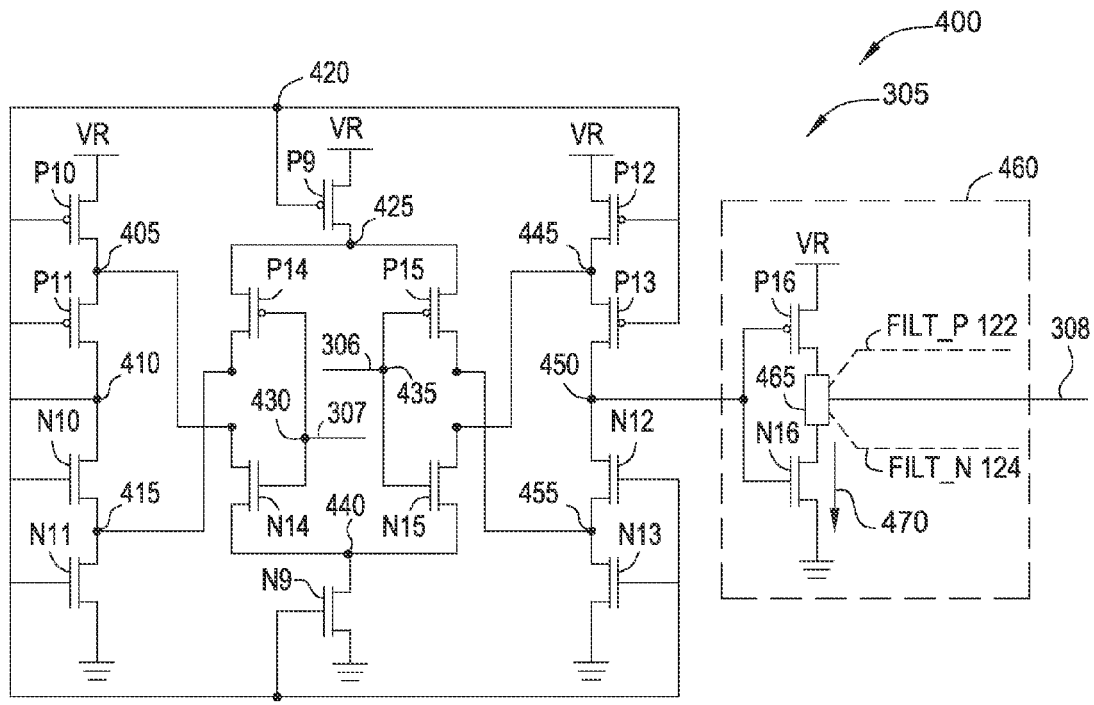
FIG. 4 illustrates an exemplary configuration of an operational amplifier included in a sense amplifier, according to one embodiment.

FIG. 4 illustrates an exemplary configuration of an operational amplifier included in a sense amplifier, according to one embodiment. The arrangement 400 provides one possible implementation of an operational amplifier 305. Arrangement 400 includes a number of PFETs P9-P16 and NFETs N9-N16. Arrangement 400 is connected to voltage rails VR, ground at various points in the circuit; other voltage rails are possible. The non-inverting input terminal 306 is connected to node 435, and the inverting input terminal 307 is connected to node 430. The operation of the input stage(s) of the operational amplifier 305 is more or less conventional and understood by the person of ordinary skill in the art.

Node 450 connects the input stage(s) of the operational amplifier 305 to an output stage 460 that includes PFET P16 and NFET N16. Typically, PFET P16 and NFET N16 may be arranged in a CMOS inverter configuration, in which the drain terminals of PFET P16 and NFET N16 are directly connected with the output terminal 308. In some embodiments, a current gating circuit 465 is disposed between the drain terminals of PFET P16 and NFET N16. In some embodiments, the conductance of the current gating circuit 465 is controlled by the filter voltage signal.

For example, the current gating circuit 465 may exhibit a relatively large conductance near the rail voltages, and a relatively low conductance when the input signal is at an operational point about halfway between the rail voltage. By providing the reduced conductance, the current gating circuit 465 presents a higher impedance near the "halfway" values of the input signal, decreasing the amount of current conducted through the output stage 460.

Figure 5:
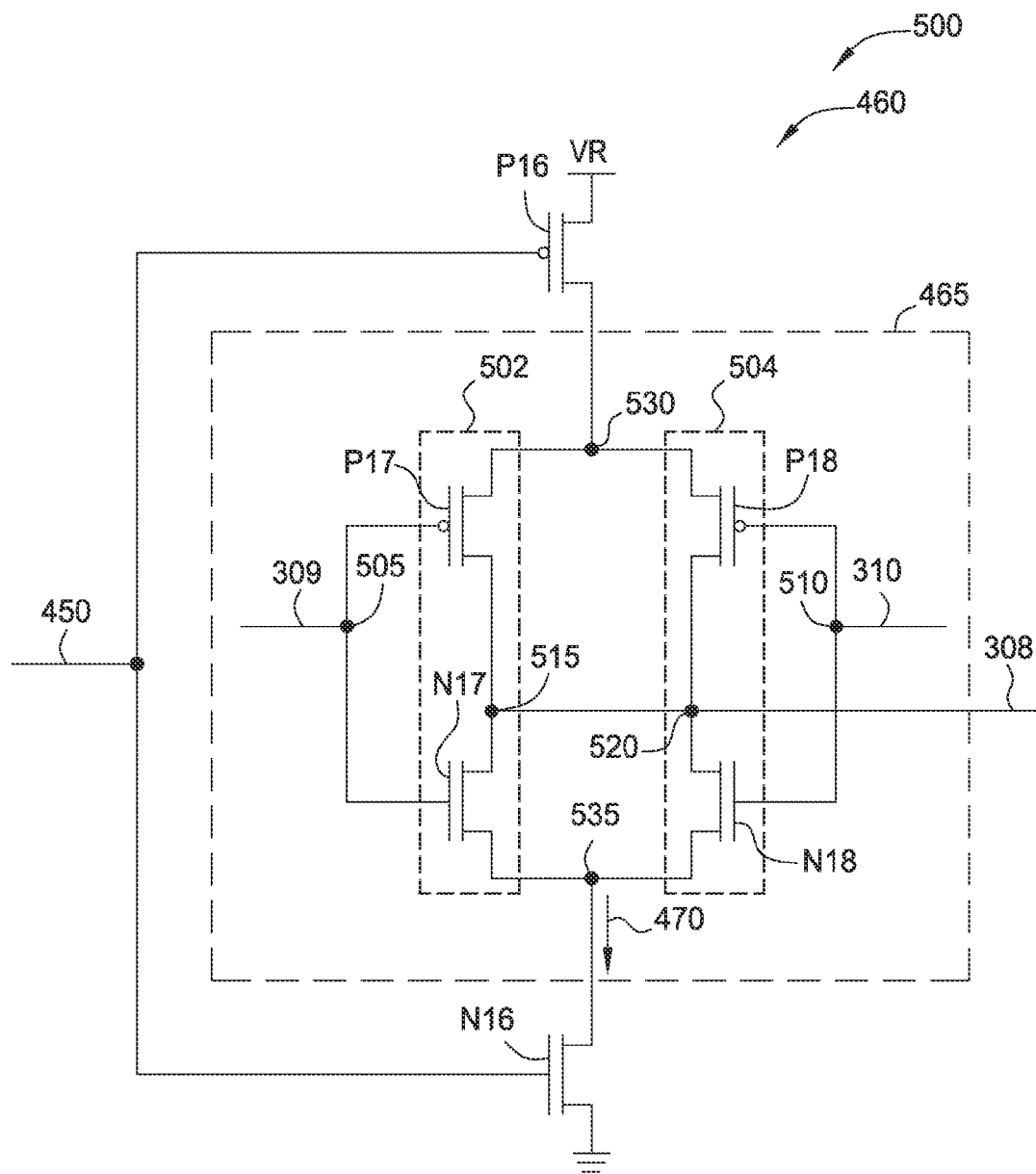
FIG. 5 illustrates a current gating circuit within an output stage of an operational amplifier, according to one embodiment.

FIG. 5 illustrates a current gating circuit within an output stage of an operational amplifier, according to one embodiment. The arrangement 500 provides one possible implementation of the output stage 460 and current gating circuit 465.

Current gating circuit 465 includes CMOS inverters 502 and 504 that are each coupled with PFET P16 at node 530 and NFET N16 at node 535. The inverter 502 includes PFET P17 and NFET N17 and is coupled at node 505 with current gating input terminal 309. Inverter 504 includes PFET P18 and NFET N18 and is coupled at node 510 with current gating input terminal 310. The outputs 515, 520 corresponding to inverters 502, 504 are directly connected with each other and with the output terminal 308 of the sense amplifier.

Figure 7:
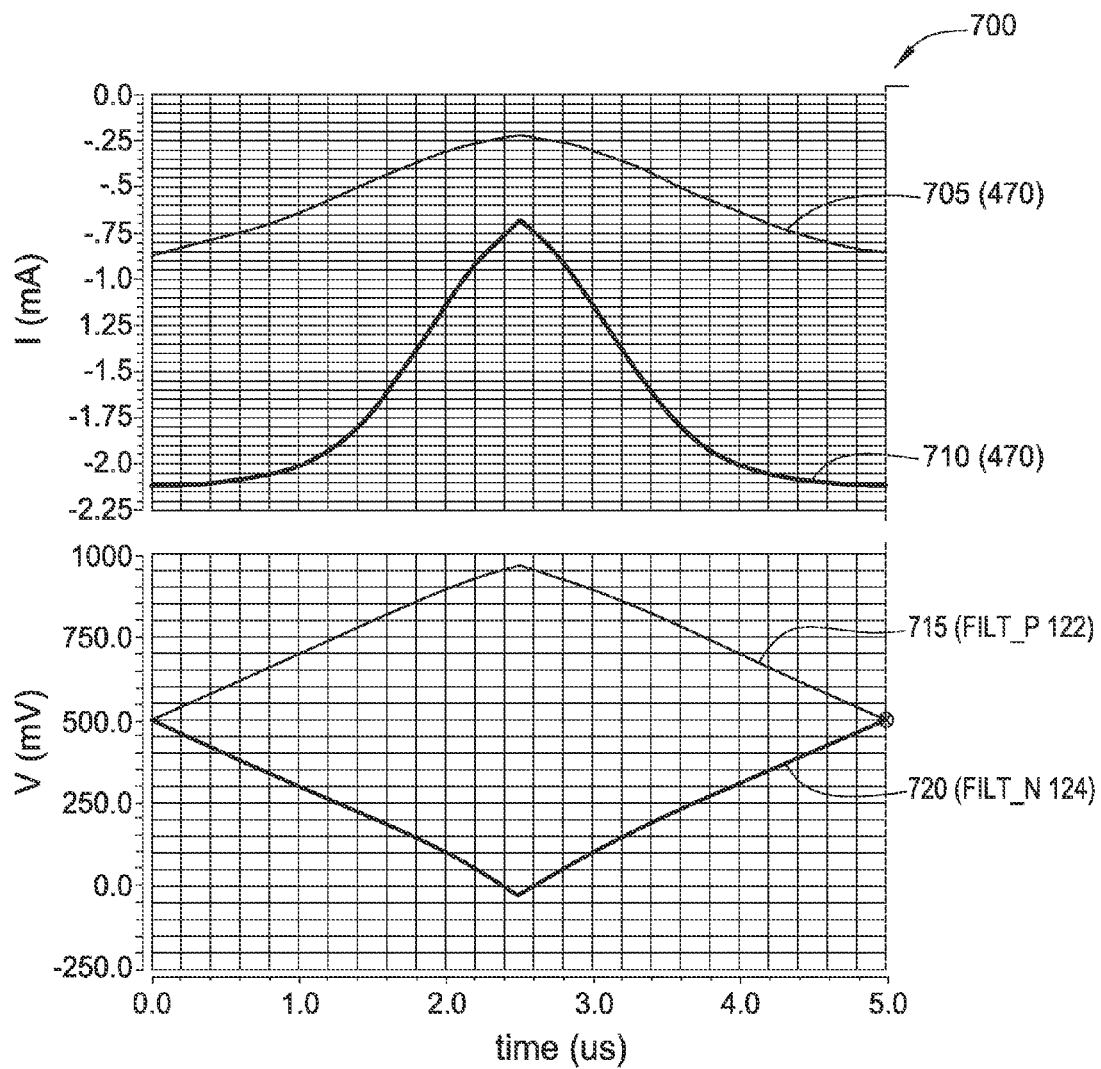
FIG. 7 includes plots of standby current in an output stage of an operational amplifier, and corresponding filter voltage values, according to one embodiment.

The conductance of PFETs P17, P18 and NFETs N17, N18 are controlled based on the filter voltage signal that is applied across the two current gating input terminals 309, 310. Reference is also made to FIG. 7, which is a plot of standby current in an output stage of an operational amplifier, according to one embodiment.

For example, say the filter voltage signal is sufficiently large that FILT_P corresponds to a rail voltage VR applied to current gating input terminal 309, while FILT_N corresponds to a rail voltage ground applied to current gating input terminal 310. Referring to FIG. 2, in this state the NFET N16 of the op-amp connected with SENSE 162 (i.e., op-amp 305A of FIG. 3) and the PFET P16 of the op-amp connected with SENSE_N 164 (i.e., op-amp 305B of FIG. 3) must be large to conduct the current sourced through NFET N7 and PFET P2 (FIG. 2). NFET N7 and PFET P2 conduct large currents because their drain-source voltages are large (e.g., the drain voltage is near one voltage rail while the source voltage is near the other voltage rail). The INC 112 and DEC 114 signals have relatively small pulses in this case, as the PLL remains locked and small amounts of current are flowing to FILT_P 122 and FILT_N 124, but during most of the time, current is flowing through alternate paths 280A, 280B.

As shown in FIG. 7 about time 2.5 microseconds, the rail voltage VR is approximately 1 V (1000 mV) and the other rail voltage is ground. The PFET P17 (at VR) and NFET N18 (at ground) are not conducting, while PFET P18 (at ground) and NFET N17 (at VR) are fully conducting, providing a path with relatively large conductance (or small resistance) between PFET P16 and NFET N16. In this case, the current gating circuit 465 acts somewhat like a short, and the output stage 460 acts like an inverter. Thus, the current gating circuit 465 is able to conduct the current associated with a full rail-to-rail operation. The standby current for current gating circuit is shown as plot 705, while the standby current for a conventional CMOS inverter (without current gating circuit) is shown as plot 710.

However, say the filter voltage signal is not so large as in the previous example. For example, say FILT_P and FILT_N are each about halfway between the rail voltages (here, VR/2), such as at times 0 and 5 microseconds in FIG. 7. This example may be representative of the nominal PLL operating condition, such that when the PLL circuit is in a "locked" condition, the PLL circuit will have a zero and minimally small voltage difference between FILT_P and FILT_N. This occurs since statistically, most of the time the PLL circuit will be operating at or near this equilibrium point and the frequency of the voltage controlled oscillator is close to the frequency of the reference signal. Here, the "halfway" voltage (VR/2) causes the PFETs P17, P18 and NFETs N17, N18 to be partially conducting (not fully on or off), and the current gating circuit 465 acts like a large resistance between PFET P16 and NFET N16, decreasing the current flowing through the output stage 460. The standby current is reduced significantly for the current gating circuit 465 (plot 705) when compared with a conventional CMOS inverter at plot 710.

While arrangement 500 provides two parallel CMOS inverters 502, 504, alternate embodiments of the current gating circuit 465 may include any circuit arrangement having its conductance suitably controlled by the filter voltage signal. For example, an alternate embodiment of current gating circuit 465 may include variable resistors.

Figure 6:
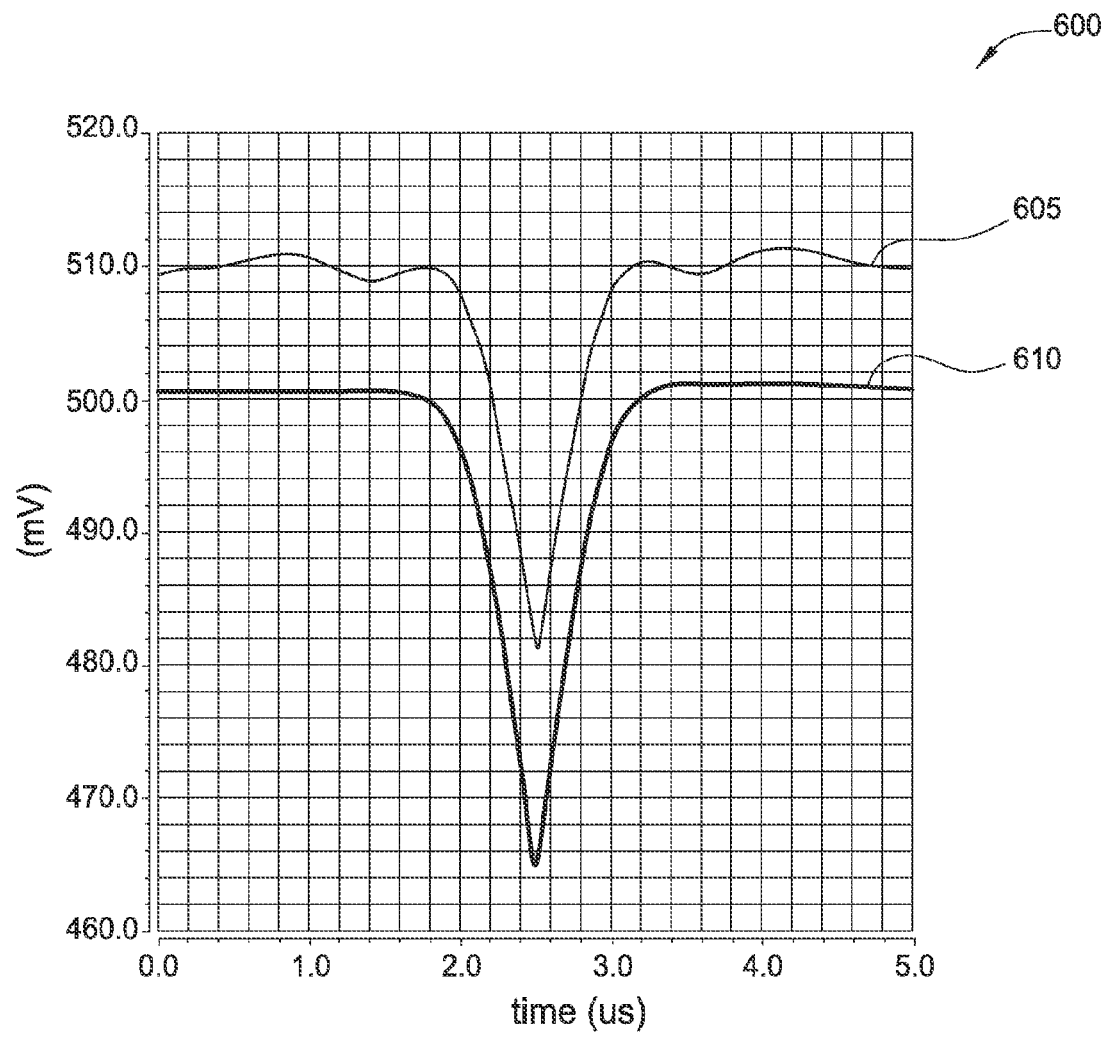
FIG. 6 is a plot of common-mode voltage using an exemplary sense amplifier, according to one embodiment.

FIG. 6 is a plot of common-mode voltage using an exemplary sense amplifier, according to one embodiment. Plot 605 represents the common mode voltage [FILT_P 122+FILT_N 124]/2 according to embodiments using the sense amplifier circuit employing a current gating circuit, while plot 610 represents the common mode voltage without the current gating circuit. The timing of FIG. 6 corresponds with that of FIG. 7, in which the FILT_P 122 and FILT_N 124 signals are shown. Generally, plot 605 shows comparable performance by the current gating circuit-enabled sense amplifier, including where the filter voltage signal has its maximum amplitude (about at time 2.5 microseconds). Plot 605 thus illustrates that the common mode can be controlled in the low power amplifier embodiments disclosed herein approximately as well as conventional higher power amplifiers.

FIG. 8 is a method of operating a sense amplifier circuit, according to one embodiment. The sense amplifier circuit comprises first and second operational amplifiers, each of which includes respective non-inverting and inverting input terminals and an output stage including a current gating circuit.

Method 800 begins at block 805, where an input voltage signal is received across the non-inverting input terminals of the first and second operational amplifiers. In some embodiments, the input voltage signal corresponds to a filter voltage signal of a PLL circuit. At block 815, the received input voltage signal is processed by the sense amplifier circuit using one or more input stages of the first and second operational amplifiers.

At block 825, the input voltage signal is applied to the respective output stage of each of the first and second operational amplifiers. More specifically, the input voltage signal is applied across a respective two current gating input terminals of the current gating circuit to control the operation thereof. In some embodiments, the input voltage signal controls a conductance of the current gating circuit. The use of the current gating circuit generally operates to reduce the amount of standby current for the sense amplifier circuit, especially where components of the filter voltage signal are operating near a halfway point between the rail voltages.

At block 835, the sense amplifier circuit generates, based on the processed input voltage signal and the applied input voltage signal, a sense voltage signal across output terminals of the first and second operational amplifiers. Method 800 ends following block 835.

The present disclosure may be embodied in a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present disclosure, other and further embodiments of the disclosure may be devised without departing from the basic scope thereof, and the scope thereof is determined by the claims that follow.

What is claimed is:

1. A sense amplifier circuit for receiving an input voltage signal, the circuit comprising:
    first and second operational amplifiers, each operational amplifier respectively comprising:
        a non-inverting input terminal;
        an inverting input terminal;
        an output stage comprising a current gating circuit having two current gating input terminals, the output stage coupled with an output terminal, the output terminal providing a feedback signal to the inverting input terminal,
    wherein the input voltage signal is received across the non-inverting input terminals of the first and second operational amplifiers, and is received across the two current gating input terminals of each of the first and second operational amplifiers, wherein the sense amplifier circuit generates a sense voltage signal across the output terminals of the first and second operational amplifiers.

2. The sense amplifier circuit of claim 1, wherein the output stage of each operational amplifier further comprises:
    a first p-channel metal-oxide-semiconductor field-effect transistor (PFET) having a first drain terminal; and
    a first n-channel metal-oxide-semiconductor field-effect transistor (NFET) having a second drain terminal,
    wherein the current gating circuit is disposed between the first and second drain terminals, and wherein the input voltage signal operates to control a conductance of the current gating circuit.

3. The sense amplifier circuit of claim 2, wherein the current gating circuit comprises:
    first and second CMOS inverters disposed in parallel and each comprising a respective second PFET and second NFET,
    wherein corresponding source terminals of the second PFETs are coupled with the first drain terminal of the first PFET, and wherein corresponding source terminals of the second NFETs are coupled with the second drain terminal of the first NFET,
    wherein one of the two current gating input terminals is an input to the first CMOS inverter, and the other of the two current gating input terminals is an input to the second CMOS inverter.

4. The sense amplifier circuit of claim 3, wherein output nodes of the first and second CMOS inverters are coupled together at a single output node, wherein the output terminal of the operational amplifier is also coupled with the single output node.

5. The sense amplifier circuit of claim 2, wherein each operational amplifier is coupled with first and second rail voltages, wherein the current gating circuit operates to reduce an amount of current flowing through the first PFET and first NFET when the input voltage signal has a value approximately halfway between the first and second rail voltages, the reduced amount of current being relative to a current flowing through an output stage in which first and second drain terminals of the first PFET and first NFET are connected together at a single output node.

6. The sense amplifier circuit of claim 1, wherein the current gating circuit comprises:
    a first complementary metal-oxide-semiconductor (CMOS) inverter having a first inverter input terminal coupled with a first current gating input terminal of the two current gating input terminals; and
    a second CMOS inverter arranged in parallel with the first CMOS inverter, the second CMOS inverter having a second inverter input terminal coupled with a second current gating input terminal of the two current gating input terminals,
        wherein a first inverter output terminal of the first CMOS inverter is coupled with a second inverter output terminal of the second CMOS inverter.

7. A method of operating a sense amplifier circuit comprising first and second operational amplifiers, each operational amplifier respectively comprising non-inverting and inverting input terminals and an output stage including a current gating circuit, the method comprising:
    receiving, across the corresponding non-inverting input terminals of the first and second operational amplifiers, an input voltage signal;

processing the received input voltage signal using one or more input stages of the first and second operational amplifiers;

applying, at the respective output stage of each of the first and second operational amplifiers, the input voltage signal across a respective pair of current gating input terminals of the current gating circuit to control the operation thereof; and generating, based on the processed input voltage signal and the applied input voltage signal, a sense voltage signal across output terminals of the first and second operational amplifiers.

8. The method of claim 7, wherein applying the input voltage signal operates to control a conductance of one or more elements of the current gating circuit.

9. The method of claim 7, wherein the output stage further includes:
a first p-channel metal-oxide-semiconductor field-effect transistor (PFET) having a first drain terminal; and
a first n-channel metal-oxide-semiconductor field-effect transistor (NFET) having a second drain terminal,
wherein the current gating circuit is disposed between the first and second drain terminals.

10. The method of claim 9, wherein each operational amplifier is coupled with first and second rail voltages, wherein the current gating circuit operates to reduce an amount of current flowing through the first PFET and first NFET when the input voltage signal has a value approximately halfway between the first and second rail voltages, the reduced amount of current being relative to a current flowing through an output stage in which first and second drain terminals of the first PFET and first NFET are connected together at a single output node.

11. The method of claim 7, wherein the current gating circuit comprises:
a first complementary metal-oxide-semiconductor (CMOS) inverter having a first inverter input terminal coupled with a first current gating input terminal of the two current gating input terminals; and
a second CMOS inverter arranged in parallel with the first CMOS inverter, the second CMOS inverter having a second inverter input terminal coupled with a second current gating input terminal of the two current gating input terminals,
wherein a first inverter output terminal of the first CMOS inverter is coupled with a second inverter output terminal of the second CMOS inverter.

12. A sense amplifier circuit for generating a sense voltage signal based on an input voltage signal, the sense amplifier circuit comprising:
a first inverting operational amplifier comprising a first non-inverting input terminal and a first output stage coupled with a first output terminal, wherein the first output stage comprises a first current gating circuit configured to receive the input voltage signal across first and second current gating input terminals; and a second inverting operational amplifier comprising a second non-inverting input terminal and a second output stage coupled with a second output terminal, wherein the second output stage comprises a second current gating circuit configured to receive the input voltage across third and fourth current gating input terminals,
wherein the input voltage signal is also received across the first and second non-inverting input terminals, and
wherein the sense voltage signal is generated across the first and second output terminals.

13. The sense amplifier circuit of claim 12, wherein each of the first current gating circuit and the second current gating circuit respectively comprises:
a first complementary metal-oxide-semiconductor (CMOS) inverter having a first inverter input terminal coupled with a first current gating input terminal of the two current gating input terminals; and
a second CMOS inverter arranged in parallel with the first CMOS inverter, the second CMOS inverter having a second inverter input terminal coupled with a second current gating input terminal of the two current gating input terminals,
wherein a first inverter output terminal of the first CMOS inverter is coupled with a second inverter output terminal of the second CMOS inverter.

14. The sense amplifier circuit of claim 12, wherein each of the first output stage and the second output stage respectively comprises:
a first p-channel metal-oxide-semiconductor field-effect transistor (PFET) having a first drain terminal; and
a first n-channel metal-oxide-semiconductor field-effect transistor (NFET) having a second drain terminal,
wherein a corresponding current gating circuit of the first current gating circuit and the second current gating circuit is disposed between the first and second drain terminals, and
wherein the input voltage signal operates to control a conductance of the corresponding current gating circuit.

15. The sense amplifier circuit of claim 14, wherein the first inverting operational amplifier and the second inverting operational amplifier are each coupled with first and second rail voltages,
wherein the corresponding current gating circuit operates to reduce an amount of a standby current of the corresponding one of the first output stage and the second output stage when the input voltage signal has a value approximately halfway between the first and second rail voltages, the reduced amount of standby current being relative to a standby current flowing through an output stage in which first and second drain terminals of the first PFET and first NFET are connected together at a single output node.

* * * * *